United States Patent
Gardner et al.

[19]

[11] Patent Number: 6,100,148
[45] Date of Patent: Aug. 8, 2000

[54] SEMICONDUCTOR DEVICE HAVING A LINER DEFINING THE DEPTH OF AN ACTIVE REGION, AND FABRICATION THEREOF

[75] Inventors: Mark I. Gardner, Cedar Creek; Derick Wristers; Jim H. Fulford, both of Austin, all of Tex.

[73] Assignee: Advanced Micro Devices, Inc., Sunnyvale, Calif.

[21] Appl. No.: 08/995,023

[22] Filed: Dec. 19, 1997

[51] Int. Cl.[7] .................................................. H01L 21/336
[52] U.S. Cl. ............................ 438/305; 438/303; 438/301
[58] Field of Search ..................................... 438/305, 303, 438/301, 296, 586

[56] References Cited

U.S. PATENT DOCUMENTS

| | | | |
|---|---|---|---|
| 4,683,637 | 8/1987 | Varker et al. ................................. | 437/63 |
| 4,700,454 | 8/1987 | Baerg et al. ................................. | 437/24 |
| 4,728,619 | 3/1988 | Pfiester et al. . | |
| 4,963,502 | 10/1990 | Teng et al. . | |
| 5,382,533 | 1/1995 | Ahmad et al. ................................. | 437/24 |
| 5,393,693 | 2/1995 | Ko et al. . | |
| 5,418,375 | 5/1995 | Hoskins et al. . | |
| 5,514,902 | 5/1996 | Kawasaki et al. . | |
| 5,561,072 | 8/1996 | Saito ............................................. | 437/24 |
| 5,567,629 | 8/1996 | Kubo ............................................ | 437/24 |
| 5,571,738 | 11/1996 | Krivokapic .................................. | 438/586 |
| 5,650,340 | 7/1997 | Burr et al. . | |
| 5,654,210 | 8/1997 | Aronowitz et al. . | |
| 5,661,046 | 8/1997 | Ilderem et al. . | |
| 5,674,760 | 10/1997 | Hong . | |
| 5,712,173 | 1/1998 | Liu et al. ..................................... | 437/24 |
| 5,792,680 | 8/1988 | Sung et al. . | |

OTHER PUBLICATIONS

U.S. application No. 08/993,223, Gardner et al., filed Dec. 18, 1997.

*Primary Examiner*—John F. Niebling
*Assistant Examiner*—Walter Lindsay, Jr.

[57] ABSTRACT

A semiconductor device having a liner which defines the depth of an active region and a process for fabricating such a device is disclosed. The use of a liner can, for example, allow the formation of shallower source/drain regions and enhance the performance of the device. In accordance with one aspect of the process, a semiconductor device is formed by forming a gate electrode over a substrate and forming a liner in the substrate adjacent to the gate electrode. An active region is then formed in the substrate, whereby the depth of an active region is defined by the liner. The liner can be formed from several materials including, for example, n-type and p-type dopants and/or oxygen-bearing species.

17 Claims, 2 Drawing Sheets

SEMICONDUCTOR DEVICE HAVING A LINER DEFINING THE DEPTH OF AN ACTIVE REGION, AND FABRICATION THEREOF

FIELD OF THE INVENTION

The present invention is directed generally to semiconductor devices and, more particularly, to a semiconductor device having a liner defining the depth of an active region, and a process for fabricating such a device.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

The source/drain regions 105, illustrated in FIG. 1, are lightly-doped-drain (LDD) structures. Each LDD structure includes a lightly-doped, lower conductivity region 106 near the channel region 107 and a heavily-doped, higher conductivity region 104 typically connected to the source/drain terminal. Generally, the LDD structures are typically formed by implanting a first dopant into active regions adjacent the gate electrode 103 at relatively low concentration levels to form the lightly-doped regions 106; forming spacers 102 on sidewalls of the gate electrode 103; and implanting a second dopant into the active regions at higher concentration levels to form the heavily-doped regions 104. The substrate is typically annealed to drive the dopant in the heavily-doped regions deeper into the substrate 101.

After the LDD structures have been formed, a relatively thick oxide layer (not shown), referred to as a contact formation layer, is disposed over the substrate 101. Openings are generally cut into the contact formation layer to expose the source/drain regions 105 and the surface of the gate electrode 103. The exposed areas are then filled with a metal, such as tungsten, which is used to connect the active elements with other devices on the chip.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. The source/drain regions have a substantial impact on the performance of a semiconductor device. For example, the drive current of a device typically increases with decreasing source/drain junction depth.

SUMMARY OF THE INVENTION

Generally, the present invention relates to a semiconductor device having a liner which defines the depth of an active region, and a process for fabricating such a device. The use of a liner can, for example, allow the formation of shallower source/drain regions and enhance the performance of the device.

In accordance with one embodiment of the invention, a semiconductor device is formed by forming a gate electrode over a substrate and forming a liner in the substrate adjacent to the gate electrode. An active region is then formed in the substrate, whereby the depth of an active region is defined by the liner. The liner can be formed from several materials including, for example, n-type and p-type dopants and/or oxygen-bearing species.

The above summary of the present invention is not intended to describe every incrementation of the present invention. The figures and the detailed description which follow exemplify the embodiments more particularly.

BRIEF DESCRIPTION OF THE DRAWINGS

The invention may be more completely understood in consideration of the detailed description of the preferred embodiment of the invention in connection with the accompanying drawings, in which.

Figure 1:
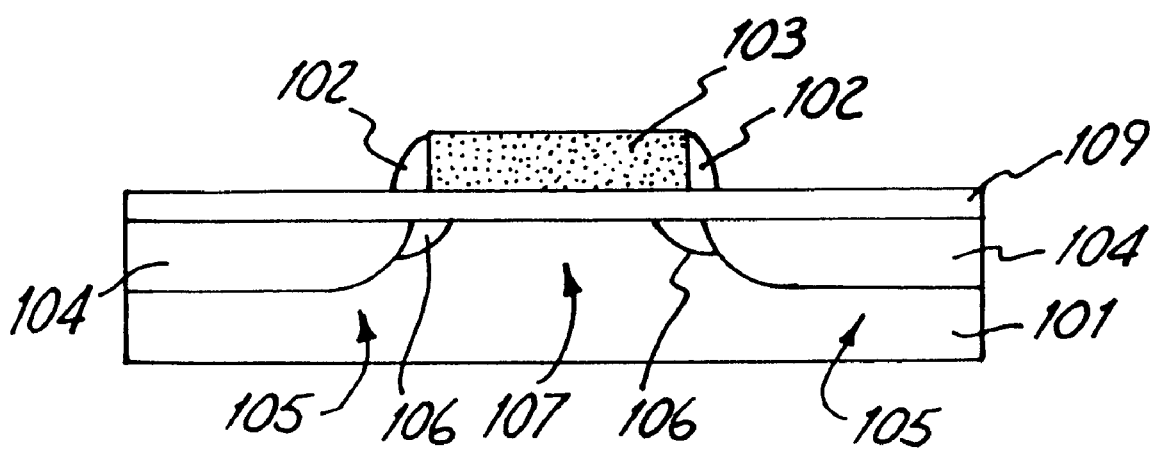
FIG. 1 is a typical MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE PREFERRED EMBODIMENTS

The present invention is believed to be applicable to a number of semiconductor devices, including in particular MOS, CMOS, and BiCMOS structures. The present invention generally provides a liner in a substrate in a semiconductor device. The liner is used to define the depth of an active region (e.g., source/drain region) of the semiconductor device. While the present invention is not so limited, an appreciation of various aspects of the invention will be gained through a discussion of the fabrication process and characteristics of such a device in connection with the examples provided below.

FIGS. 2A–2E illustrate an exemplary process for fabricating a semiconductor device with a liner defining the depth of the active regions of the device. In accordance with this exemplary process, a gate insulating layer 203, such as an oxide layer, is formed on a semiconductor substrate 201. The gate insulating layer 203 may be formed using, for example, well-known deposition or growth techniques. A gate electrode layer 205, typically a polysilicon layer, is formed on top of the gate insulating layer 203. The gate electrode layer 205 may, for example, be formed using well-known deposition techniques.

A masking layer 207 is then formed on top of the polysilicon layer 205. The masking layer 207 may, for example, be formed from a photoresist. However, it is noted that other materials can be used. As will be described below, the masking layer 207 is used to selectively remove the gate electrode layer 205 to form one or more gate electrodes. The masking layer 207 will also typically be used to protect the underlying gate electrodes from undesired implantation of dopants or other materials used to form a liner. The thickness of the masking layer 207 is typically selected in consideration of the implant used to form the liner. Suitable thicknesses range from 10K to 50K Å for many applications.

Figure 2A:
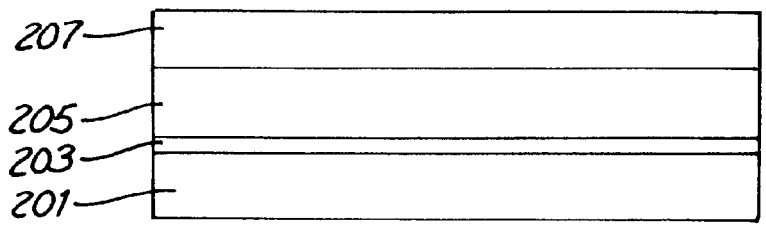
FIGS. 2A–2E illustrate an exemplary process in accordance with one embodiment of the invention.
Figure 2B:
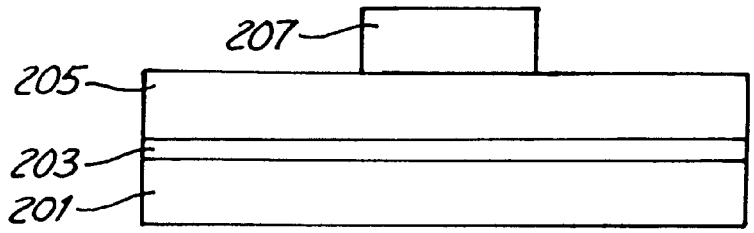
Figure 2C:
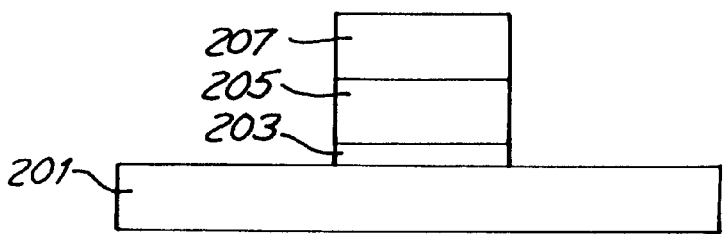

Portions of the masking layer 207 are removed to expose regions of the gate electrode layer 205, as shown in FIG. 2B. This may be done using, for example, well-known photolithography and etching techniques. Exposed portions of the gate electrode layer 205 and typically the underlying gate insulating layer 203 are removed using, for example, well-known etching techniques. The resultant structure shown in FIG. 2C includes a remaining block of the masking layer 207, the gate electrode layer 205, and the gate insulating layer 203 on the substrate 201. The remaining gate electrode layer 205 and gate insulating layer 203 are typically used as a gate electrode structure.

Figure 2D:
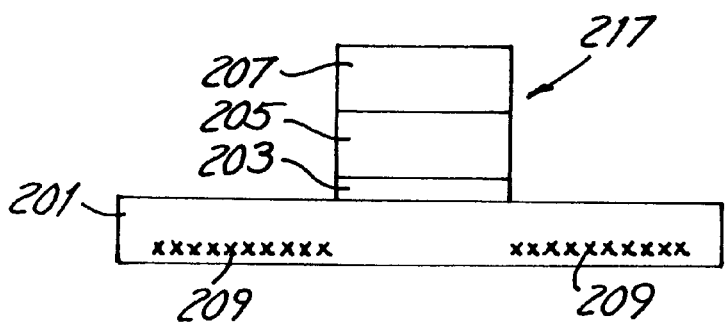

As shown in FIG. 2D, a liner 209 is formed in portions of the substrate 201 adjacent the gate electrode 217. The liner 209 will be used to define the junction depth of active regions 213 which will be formed adjacent the gate electrode 217.

A number of different materials can be used to form the liner 209. In one embodiment of the invention the liner 209 is an oxygen-rich region. The oxygen-rich region may, for example, be formed by implanting an oxygen-bearing species, such as O or $O_2$. As will be discussed below, the oxygen-rich region generally inhibits dopants used to form the active region 213 from diffusing deeper into the substrate 201, and in this manner defines the depth of the active regions 213.

The implant characteristics depend on the oxygen-bearing species used and the desired oxygen-rich region depth and thickness. The oxygen-rich region depth and thickness are in turn selected in consideration of the desired active region depth. For many applications, the thickness of the oxygen-rich region may range from about 100 to 500 Å, and the upper delimitation of the oxygen-rich region may be situated at a depth ranging from about 300 to 1,500 Å from the surface of the substrate 201. Suitable implant energies may range from about 10 to 300 keV. The concentration with which the oxygen-bearing species or the oxygen ions are implanted in the substrate 201 ranges from about 5E13 to 5E15 (i.e. $5\times10^{13}$ to $5\times10^{15}$) atoms/$cm^2$.

The oxygen-bearing species implant generally forms an oxygen-rich region in the substrate. At higher dosages (e.g. 5E13 atoms/$cm^2$ and above) the oxygen-rich region is a silicon dioxide region.

In another embodiment of the invention, the liner 209 is formed using a dopant having a conductivity type opposite that of the dopant used to form the active region 213. If the dopant used to form the active region is n-type, then the liner dopant is p-type. If the dopant used to form the active region is p-type, then the liner dopant is n-type. The liner dopant defines the depth of the active region 213 by counteracting the presence of the charge carriers introduced by the dopant material used to form the active region 213.

The implant characteristics of the liner dopant depend on the dopant used and the desired liner depth. The liner depth is selected in consideration of the desired active region depth. For example, the thickness of the liner 209 formed by a liner dopant may range from about 100 to 500 Å, and the upper delimitation of the liner 209 may be situated at a depth ranging from about 300 to 1,500 Å from the surface of the substrate 201. For example, with an NMOS device, the liner dopant may be a p-type dopant including a boron-bearing species, such as B or $BF_2$. Suitable implant energies and dosages for a boron liner dopant range from about 30 to 150 keV and about 5E14 to 5E16 atoms/$cm^2$ for many applications. Suitable implant energies and dosages for a $BF_2$ liner dopant range from about 120 to 600 keV and about 5E14 to 5E16 atoms/$cm^2$ for many applications.

The masking layer 207 is typically left on the gate electrode 217 during liner formation, to protect the gate electrode 217 from being implanted with the material used to form the liner 209. If it is desired to implant the gate electrode 217 with the material used to form the liner 209, the masking layer 207 may be taken off prior to such implantation. In any event, the masking layer 207 is typically removed from the gate electrode layer 205 prior to forming the active regions 213. This allows, for example, the gate electrode layer 205 to be doped with the dopant used in forming the active regions 213, if desired.

Figure 2E:
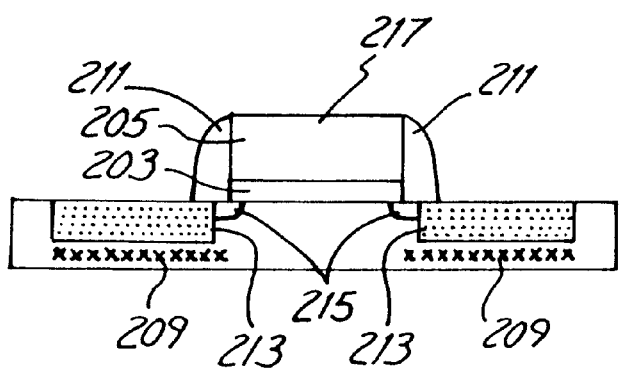

Active regions 213 are formed in the substrate 201, adjacent the gate electrode 217, as shown in FIG. 2E. In the illustrated embodiment, the active regions 213 are LDD (lightly-doped-drain) source/drain regions. An LDD source/drain region may be formed by making two implants in the substrate 201. Typically, the first implant is a light dose of a dopant (e.g. arsenic or boron), and the second implant is a heavier dose of a similar-type or the same dopant. The first dose is typically implanted into the substrate 201 when the semiconductor device has the configuration shown in FIG. 2D. This forms a lightly-doped region 215, as shown in FIG. 2E. Before the second dose is implanted, spacers 211 are formed adjacent to the gate electrode layer 205 and the gate insulating layer 203. The spacers are used to space the second dopant implant from the gate electrode 217. The second implant forms heavily-doped regions 213. After the second heavier dose of dopant has been implanted, the device may have the configuration shown in FIG. 2E. The dopant implants, as well as spacer formation, may be done using well-known techniques.

The conductivity type of the dopant(s) used in forming the active regions 213 depends on the type (e.g. NMOS or PMOS) of device being formed. For example, in an NMOS transistor the source/drain regions are formed by implanting an n-type dopant, such as arsenic or phosphorus. Correspondingly, in an PMOS transistor the source/drain regions are formed by implanting a p-type dopant, such as boron.

The substrate 201 is typically annealed to activate the dopant used in forming the active regions 213 and to improve the distribution of the dopant in the substrate 201. The dopant typically tends to diffuse into the substrate 201 due to the anneal. Where the liner 207 is an oxygen-rich region (e.g. a silicon dioxide region), the oxygen-rich region defines the depth of the active regions 213 by inhibiting the dopant from diffusing through the oxygen-rich region.

Where the liner 207 is formed by implanting a liner dopant having a conductivity type opposite that of the active region dopant, the liner dopant defines the depth of the active region 213 by counteracting the presence of the charge carriers introduced by the active region dopant. For example, with an NMOS, a p-type liner dopant in the liner 209 is used to counteract the charge carriers introduced by an n-type active region dopant, thereby defining the depth of active region 213.

Following the anneal of the active region dopants, fabrication of the semiconductor device may continue with well-known processing steps such as silicidation, contact formation, and so forth, to complete the device structure.

Using the above process, a semiconductor device can be fabricated having a liner defining the active region junction depth. The use of a liner can, for example, allow the formation of shallower active region junction depths as compared to conventional processes. For example, active regions having junction depths ranging from about 0.03 to 0.1 micron can be formed using the above process. Shallower junctions in turn can increase device performance by, for example, increasing the drive current of the device. The liner can additionally, for example, inhibit the flow of hot charge carriers between, for example, the drain and a grounded portion of the device.

The present invention is applicable to the fabrication of a number of different devices which may benefit from the use of a liner to define active region junction depth. Such devices include, but are not limited to, MOS, CMOS, and BiCMOS structures. Accordingly, the present invention cannot be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed, upon review of the present specification. The claims are intended to cover such modifications and devices.

We claim:

1. A process of fabricating a semiconductor device, comprising:
    forming a gate electrode over a substrate;
    forming a liner in the substrate adjacent the gate electrode; and
    forming an active region in the substrate having a depth defined by the liner, wherein the liner is formed from a liner dopant having a conductivity type opposite that of an active region dopant used to form the active region.

2. The process of claim 1, wherein forming the liner in the substrate includes implanting the liner dopant into the substrate.

3. The process of claim 2, wherein the liner dopant is implanted with a concentration of between about 5E14 and about 5E16 atoms/cm$^2$.

4. The process of claim 2, wherein the liner dopant includes a boron-containing species.

5. The process of claim 4, wherein the boron-containing species is boron.

6. The process of claim 5, wherein the boron is implanted with an energy between about 30 and about 150 keV.

7. The process of claim 4, wherein the liner dopant is borondifluoride.

8. The process of claim 7, wherein the borondifluoride is implanted with an energy between about 120 and about 600 keV.

9. The process of claim 1, wherein the liner is formed at a depth between about 1 and about 1.2 microns.

10. The process of claim 1, wherein the active region is a source/drain region.

11. The process of claim 10, wherein the source/drain region is an LDD source/drain region.

12. The process of claim 1, wherein forming the gate electrode includes using a mask to define the gate electrode, and forming the liner includes implanting a material into the substrate.

13. The process of claim 12, wherein the mask is formed from a photoresist.

14. The process of claim 1, further including removing the mask after forming the liner, so that the mask inhibits the liner from being implanted into the gate electrode.

15. The process of claim 1, further comprising the step of annealing the semiconductor device, whereby the liner prevents the dopant from diffusing deeper into the semiconductor substrate.

16. A process of fabricating a semiconductor device, comprising:
    forming a gate electrode over a substrate;
    forming a liner in the substrate adjacent the gate electrode;
    forming an active region in the substrate having a depth defined by the liner, wherein the liner is formed from a liner dopant having a conductivity type opposite that of an active region dopant used to form the active region;
    forming a spacer on both sides of the gate electrode; and
    implanting the active region with a dopant different from the dopant used to form the active region.

17. A process of fabricating a semiconductor device, comprising:
    forming a gate electrode over a substrate;
    forming a liner in the substrate adjacent the gate electrode;
    forming an active region in the substrate having a depth defined by the liner, wherein the liner has a thickness of about 100–500 angstroms and is formed from a liner dopant having a conductivity type opposite that of an active region dopant used to form the active region, the liner dopant selected from one of boron and borondifluoride;
    forming a spacer on both sides of the gate electrode; and
    implanting the active region with a dopant different from the dopant used to form the active region.

* * * * *

UNITED STATES PATENT AND TRADEMARK OFFICE
CERTIFICATE OF CORRECTION

PATENT NO. : 6,100,148
DATED : August 8, 2000
INVENTOR(S) : Gardner et al.

It is certified that error appears in the above-identified patent and that said Letters Patent is hereby corrected as shown below:

On the title page, Item [75], the name of the third-named inventor should be "H. Jim Fulford".

Signed and Sealed this

Twenty-ninth Day of May, 2001

Attest:

NICHOLAS P. GODICI

*Attesting Officer*     *Acting Director of the United States Patent and Trademark Office*